United States Patent
Sharma et al.

(10) Patent No.: US 7,195,927 B2
(45) Date of Patent: Mar. 27, 2007

(54) PROCESS FOR MAKING MAGNETIC MEMORY STRUCTURES HAVING DIFFERENT-SIZED MEMORY CELL LAYERS

(75) Inventors: Manish Sharma, Mountain View, CA (US); Thomas C. Anthony, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 258 days.

(21) Appl. No.: 10/691,139

(22) Filed: Oct. 22, 2003

(65) Prior Publication Data

US 2005/0087511 A1 Apr. 28, 2005

(51) Int. Cl.
*H01L 21/302* (2006.01)

(52) U.S. Cl. .......................... 438/3; 438/701; 438/717; 438/734; 438/736; 438/737; 438/739; 438/749

(58) Field of Classification Search ............... 438/3, 438/701, 717, 734, 736, 737, 739, 749
See application file for complete search history.

(56) References Cited

U.S. PATENT DOCUMENTS

| | | | | |
|---|---|---|---|---|
| 6,110,751 | A * | 8/2000 | Sato et al. | 438/3 |
| 6,404,674 | B1 | 6/2002 | Anthony et al. | |
| 6,528,326 | B1 * | 3/2003 | Hiramoto et al. | 438/3 |
| 6,570,783 | B1 | 5/2003 | Deak | |
| 6,664,785 | B2 * | 12/2003 | Kohlstedt | 324/252 |
| 6,683,815 | B1 * | 1/2004 | Chen et al. | 365/225.5 |
| 6,781,173 | B2 * | 8/2004 | Tuttle et al. | 257/295 |
| 6,852,550 | B2 * | 2/2005 | Tuttle et al. | 438/3 |

* cited by examiner

*Primary Examiner*—George A. Goudreau

(57) ABSTRACT

An exemplary method for making a memory structure having different-sized memory cell layers comprises forming at least two layers of ferromagnetic materials, forming at least one mask layer above the ferromagnetic materials, patterning the at least one mask layer, etching the ferromagnetic materials using the at least one mask layer as a first etch transfer mask, laterally reducing a planar dimension of the at least one mask layer to be narrower than the ferromagnetic materials, and etching a layer of the ferromagnetic materials using the reduced at least one mask layer as a second etch transfer mask, such that the ferromagnetic layer being etched becomes a different lateral size than another ferromagnetic layer of the ferromagnetic materials.

20 Claims, 6 Drawing Sheets

PROCESS FOR MAKING MAGNETIC MEMORY STRUCTURES HAVING DIFFERENT-SIZED MEMORY CELL LAYERS

BACKGROUND

A memory chip generally comprises a plurality of memory cells that are deposited onto a silicon wafer and addressable via an array of column conducting leads (bit lines) and row conducting leads (word lines). Typically, a memory cell is situated at the intersection of a bit line and a word line. The memory cells are controlled by specialized circuits that perform functions such as identifying rows and columns from which data are read from or to which data are written. Typically, each memory cell stores data in the form of a "1" or a "0," representing a bit of data.

An array of magnetic memory cells can be referred to as a magnetic random access memory or MRAM. MRAM is generally nonvolatile memory (i.e., a solid state chip that retains data when power is turned off). At least one type of magnetic memory cell includes a data layer and a reference layer, separated from each other by at least one intermediate layer. The data layer may also be referred to as a bit layer, a storage layer, or a sense layer. In a magnetic memory cell, a bit of data (e.g., a "1" or "0") may be stored by "writing" into the data layer via one or more conducting leads (e.g., a bit line and a word line). A typical data layer might be made of one or more ferromagnetic material. The write operation is typically accomplished via a write current that sets the orientation of the magnetic moment in the data layer to a predetermined direction.

Once written, the stored bit of data may be read by providing a read current through one or more conducting leads (e.g., a read line) to the magnetic memory cell. For each memory cell, the orientations of the magnetic moments of the data layer and the reference layer are either parallel (in the same direction) or anti-parallel (in different directions) to each other. The degree of parallelism affects the resistance of the cell, and this resistance can be determined by sensing (e.g., via a sense amplifier) an output current or voltage produced by the memory cell in response to the read current.

More specifically, if the magnetic moments are parallel, the resistance determined based on the output current is of a first relative value (e.g., relatively low). If the magnetic moments are anti-parallel, the resistance determined is of a second relative value (e.g., relatively high). The relative values of the two states (i.e., parallel and anti-parallel) are typically different enough to be sensed distinctly. A "1" or a "0" may be assigned to the respective relative resistance values depending on design specification.

The intermediate layer, which may also be referred to as a spacer layer, may comprise insulating material (e.g., dielectric), non-magnetic conducting material, and/or other known materials, and is usually thick enough to prevent exchange coupling between the data and reference layers. The various conducting leads which are used to address the memory cells (e.g., bit lines, word lines, and read lines), and to provide currents to pass through the data and reference layers to read data from or write data to the memory cells are provided by one or more additional layers, called conducting layer(s).

The layers described above and their respective characteristics are typical of magnetic memory cells based on tunneling magnetoresistance (TMR) effects known in the art. Other combinations of layers and characteristics may also be used to make magnetic memory cells based on TMR effects. See, for example, U.S. Pat. No. 6,404,674, issued to Anthony et al., which is hereby incorporated by reference in its entirety for all purposes.

Still other configurations of magnetic memory cells are based on other well known physical effects (e.g., giant magnetoresistance (GMR), anisotropic magnetoresistance (AMR), colossal magnetoresistance (CMR), and/or other physical effects).

Throughout this application, various exemplary embodiments will be described in reference to the TMR memory cells as first described above. Those skilled in the art will readily appreciate that the exemplary embodiments may also be implemented with other types of magnetic memory cells known in the art (e.g., other types of TMR memory cells, GMR memory cells, AMR memory cells, CMR memory cells, etc.) according to the requirements of a particular implementation.

Generally speaking, desirable characteristics for any configuration of memory device include increased speed, reduced power consumption, and/or lower cost. A simpler fabrication process and/or a smaller chip size may achieve lower cost. However, as magnetic memory cells become smaller, typically, fringe magnetic fields produced at the edges of the reference layer may unacceptably affect nearby data layers during read/write operations. The fringe magnetic fields can influence the switching characteristics of the memory cell. Typically, the data layer has an inherent resistance (i.e., based on the data layer's material and thickness) that is overcome when attempting to change the magnetic orientation of the data layer (e.g., during a write operation). The inherent resistance, or coercivity, can be affected by other magnetic fields present near the data layer, such as the fringe magnetic fields emanating from the edges of the reference layer. As a result, data stored in the data layer may be corrupted. One way to reduce fringe magnetic fields is to have a different sized reference layer relative to the data layer. For example, the reference layer may be larger or smaller (i.e., in either or both vertical and horizontal dimensions) relative to the data layer. However, making different sized reference and data layers may introduce more complexity and cost (i.e., additional patterning steps) into the fabrication process.

Thus, a market exists for a simplified process to make memory cells having different sized data and reference layers.

SUMMARY

An exemplary method for making a memory structure having different-sized memory cell layers comprises forming at least two layers of ferromagnetic materials, forming at least one mask layer above the ferromagnetic materials, patterning the at least one mask layer, etching the ferromagnetic materials using the at least one mask layer as a first etch transfer mask, laterally reducing a planar dimension of the at least one mask layer to be narrower than the ferromagnetic materials, and etching a layer of the ferromagnetic materials using the reduced at least one mask layer as a second etch transfer mask, such that the ferromagnetic layer being etched becomes a different lateral size than another ferromagnetic layer of the ferromagnetic materials.

Other embodiments and implementations are also described below.

DETAILED DESCRIPTION

I. Overview

Exemplary improved manufacturing processes for making improved magnetic memory structures are described herein.

Section II describes an exemplary magnetic memory structure in the prior art.

Section III describes an exemplary self-aligned via process for making the magnetic memory structure of Section II.

Section IV describes an exemplary improved magnetic memory structure.

Section V describes an exemplary improved self-aligned via process for making the exemplary improved magnetic memory structure.

II. An Exemplary Memory Structure Configuration in the Prior Art

Figure 1:
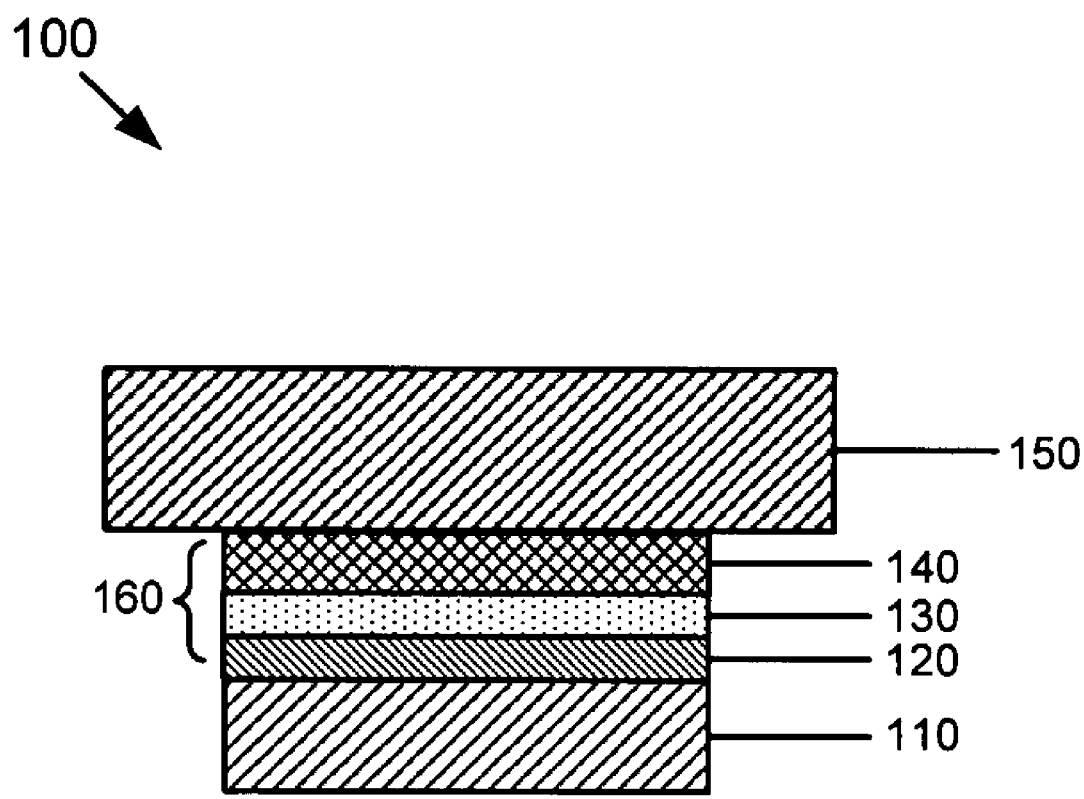
FIG. 1 illustrates an exemplary magnetic memory structure configuration in the prior art.

FIG. 1 illustrates an elevation view of an exemplary magnetic memory structure 100 in the prior art. Generally, a memory structure may be made as top-pinned (where the reference layer is on top of the data layer) or bottom-pinned (where the reference layer is below the data layer). For ease of explanation, only the top-pinned configuration is shown in FIG. 1 and referenced in the description of various exemplary embodiments herein. However, this configuration is merely illustrative. Thus, one skilled in the art will readily appreciate that other configurations (e.g., bottom-pinned, etc.) may also be implemented using the exemplary processes disclosed herein in accordance with any particular design requirement.

A. An Exemplary Top-Pinned Memory Structure in the Prior Art

The memory structure 100 includes a first conductor 110, a data layer 120, a spacer layer 130, a reference layer 140, and a second conductor 150. For ease of explanation, the combination of the data layer 120, the spacer layer 130, and the reference layer 140 may also be referred to as a memory cell 160. Of course, the memory cell 160 may also be bottom-pinned (not shown), in which case the reference layer 140 is below the data layer 120. In the exemplary configuration illustrated in FIG. 1, the first conductor 110 and the second conductor 150 are orthogonal to each other and are collectively used for both write and read operations.

One skilled in the art will recognize that the memory structure configuration as illustrated in FIG. 1 is merely illustrative. Other configurations, for example, configurations having additional conductor(s) (e.g., separate conductors for read operations) and/or configurations having additional layers are also known in the prior art. For example, another magnetic memory structure configuration may also include a seed layer, an antiferromagnetic (AFM) layer, a protective cap layer, and/or other layers. The seed layer generally enhances crystalline alignment within the AFM layer. Exemplary materials for a seed layer include Ta, Ru, NiFe, Cu, or combinations of these materials. The AFM layer generally enhances magnetic stability in the reference layer 140. Exemplary materials for an AFM layer include IrMn, FeMn, NiMn, PtMn, and/or other well known materials. The protective cap layer protects the data layer 120 from the environment (e.g., by reducing oxidation of the data layer 120) and may be formed using any suitable material known in the art, for example, Ta, TaN, Cr, Al or Ti. For ease of explanation, these additional layers are not shown in the Figures; however, magnetic memory structures having one or more of these additional layers may be implemented with various embodiments to be described herein in accordance with a particular design choice.

The first and second conductors 110, 150, may be made of Cu, Al, AlCu, Ta, W, Au, Ag, alloys of one or more of the above, and/or other conducting material(s) and alloy(s). The conductors may be formed by deposition or other techniques known in the art (e.g., sputtering, evaporation, electroplating, etc.).

The data layer 120 may comprise one or more ferromagnetic materials. In an exemplary embodiment, ferromagnetic materials suitable for the data layer 120 include, without limitation, NiFe, NiFeCo, CoFe, other magnetic alloys of NiFe and Co, amorphous ferromagnetic alloys, and other materials.

In an exemplary embodiment, the spacer layer 130 is a tunnel barrier layer (e.g., if the memory cell 100 is a TMR memory cell). In this embodiment, the spacer layer 130 may be made of $SiO_2$, $SiN_x$, $MgO$, $Al_2O_3$, $AlN_x$, $TaO_x$, and/or other insulating materials.

In another exemplary embodiment, the spacer layer 130 is a non-magnetic conducting layer (e.g., if the memory cell 100 is a GMR memory cell). In this embodiment, the spacer layer 130 may be made of Cu, Au, Ag, and/or other non-magnetic conducting materials.

The reference layer 140 may comprise a single layer of material or multiple layers of materials. For example, the reference layer 140 may comprise one or more ferromagnetic materials. In an exemplary embodiment, ferromagnetic materials suitable for the reference layer 140 include NiFe, NiFeCo, CoFe, other magnetic alloys of NiFe and Co, amorphous ferromagnetic alloys, and other materials.

Generally, the physical configurations of magnetic memory structures in the prior art, such as the one shown in FIG. 1, are very complex, and thus, require complex fabrication steps. Small dimensions and multiple layers of the conventional magnetic memory structures require precise, and numerous, masking steps with an associated risk of having some shorted memory cells. For example, making an electrical connection between conductor 150 and the reference layer 140 has typically been challenging because any spillage of the conducting material onto the data layer 120 can cause a short circuit and render the affected magnetic memory cell(s) useless. An exemplary process for making an electrical connection between conductor 150 and the reference layer 140 is known in the art as the "self-aligned via" process. An exemplary self-aligned via process is described in Section III below.

III. An Exemplary Self-Aligned Via Process for Making the Magnetic Memory Structure of FIG. 1

FIGS. 2A–2G illustrate an exemplary self-aligned via process for manufacturing the exemplary memory structure as shown in FIG. 1.

Figure 2A:
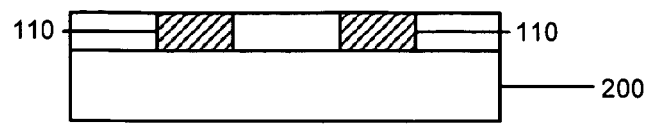
FIGS. 2A–2G illustrate an exemplary process for making the exemplary magnetic memory structure of FIG. 1.

In FIG. 2A, a first conductor 110 is formed on a substrate 200. The first conductor 110 is formed in accordance with methods known in the art. For example, the first conductor 110 may be formed using electroplating, sputtering or other suitable deposition process then planarized by a planarizing process such as chemical mechanical planarization (CMP).

Figure 2B:
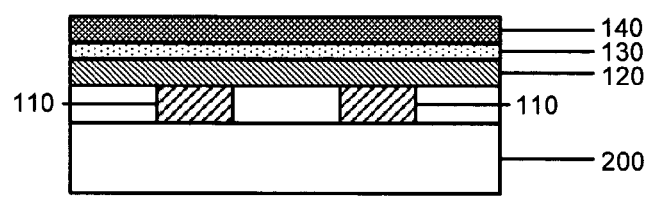

In FIG. 2B, a data layer 120, a spacer layer 130, and a reference layer 140 are formed on the first conductor 110. These layers may be formed by deposition and/or other techniques known in the art (e.g., via sputtering, evaporation, chemical vapor deposition, atomic layer deposition (ALD), and/or other known techniques).

Figure 2C:
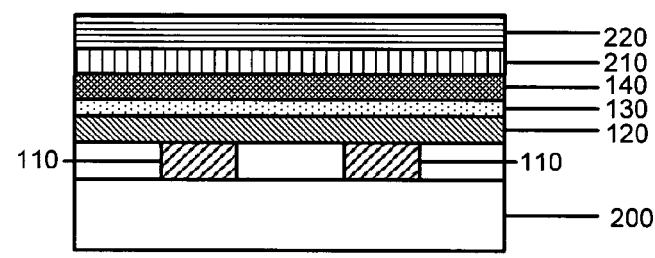

In FIG. 2C, a first mask layer 210 and a second mask layer 220 are formed. In a typical implementation of a self-aligned via process, the first and second mask layers 210 and 220 are made of photoresist materials having different organic compositions relative to each other. These layers may be formed by spinning and baking processes, and/or other processes known in the art.

Figure 2D:
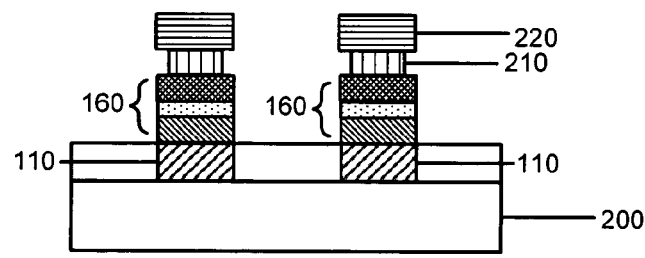

In FIG. 2D, the second mask layer 220 is patterned by a first mask using patterning methods known in the art (e.g., expose to light then develop in solvent). Next, portions of the first mask layer 210 (including some portions under the patterned second mask layer 220) are removed until small undercuts appear below the second mask layer 220. In an exemplary implementation, this may be achieved by using a wet chemical etch with a solvent selective to the first mask layer 210 relative to the second mask layer 220. By knowing the rate at which a given photoresist dissolves in a solvent, one can allot sufficient time to dissolve just the right amount of the first mask layer 210 to achieve the structure shown in FIG. 2D. Alternatively, dry etching methods, such as reactive ion etching, can be used to remove first mask layer 210 and create the structure in FIG. 2D. Next, the patterned first and second mask layers 210, 220 are used to etch the reference layer 140, spacer layer 130, and the data layer 120 to form the memory cell 160, using etching techniques known in the art.

Figure 2E:
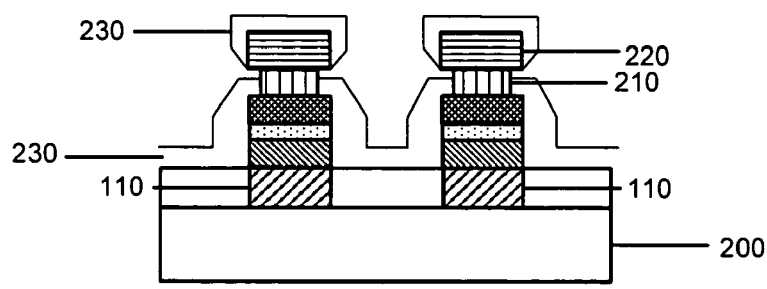

In FIG. 2E, a layer of dielectric material 230 is formed using deposition or other techniques known in the art. Because of the undercuts below the second mask layer 220, some portions of the sidewalls of the first mask layer 210 will not be coated with the dielectric material 230.

Figure 2F:
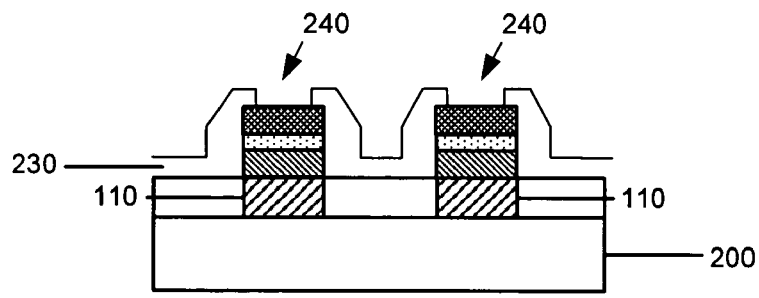

In FIG. 2F, the first and second mask layers 210, 220 are removed using etching (dry or wet) techniques known in the art. Of course, the dielectric material 230 on top of the second mask layer 220 is also removed when the first and second mask layers 210, 220 are removed. At this point, a via 240 substantially surrounded by dielectric material 230 is formed on top of the memory cell 160 and a second conductor may be formed without concern for short circuits that may be created by spillage of the conducting material onto another layer of the memory cell 160, for example, the data layer 120.

Figure 2G:
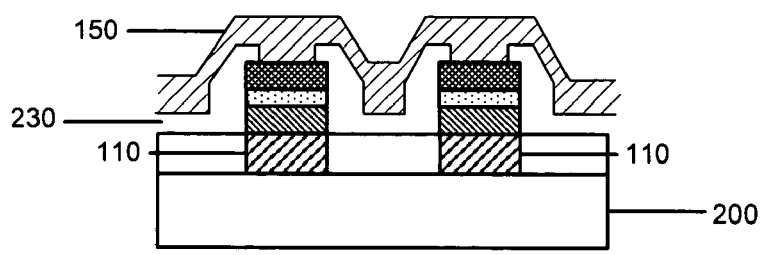

In FIG. 2G, the second conductor 150 is formed by deposition and patterning techniques known in the art.

The manufacturing steps illustrated above are merely exemplary. Those skilled in the art will appreciate that other manufacturing steps may be used in accordance with the requirements of a particular implementation. For example, the various layers as illustrated in FIGS. 2A–2G may be formed in accordance with other manufacturing sequences (e.g., the reference layer 140 may be formed first in a bottom-pinned memory structure), one or more layers may be formed at the same time, one or more layers of different materials may be combined to form a single layer (e.g., a data layer), etc.

Further, the TMR memory cell illustrated above is merely exemplary. Those skilled in the art will appreciate that other types of memory cells (e.g., GMR memory cells, etc.) may be constructed according to the requirements of a particular implementation. For example, the spacer layer 130 may be a non-magnetic conducting layer for constructing a GMR memory cell.

IV. An Exemplary Improved Magnetic Memory Structure

Figure 3:
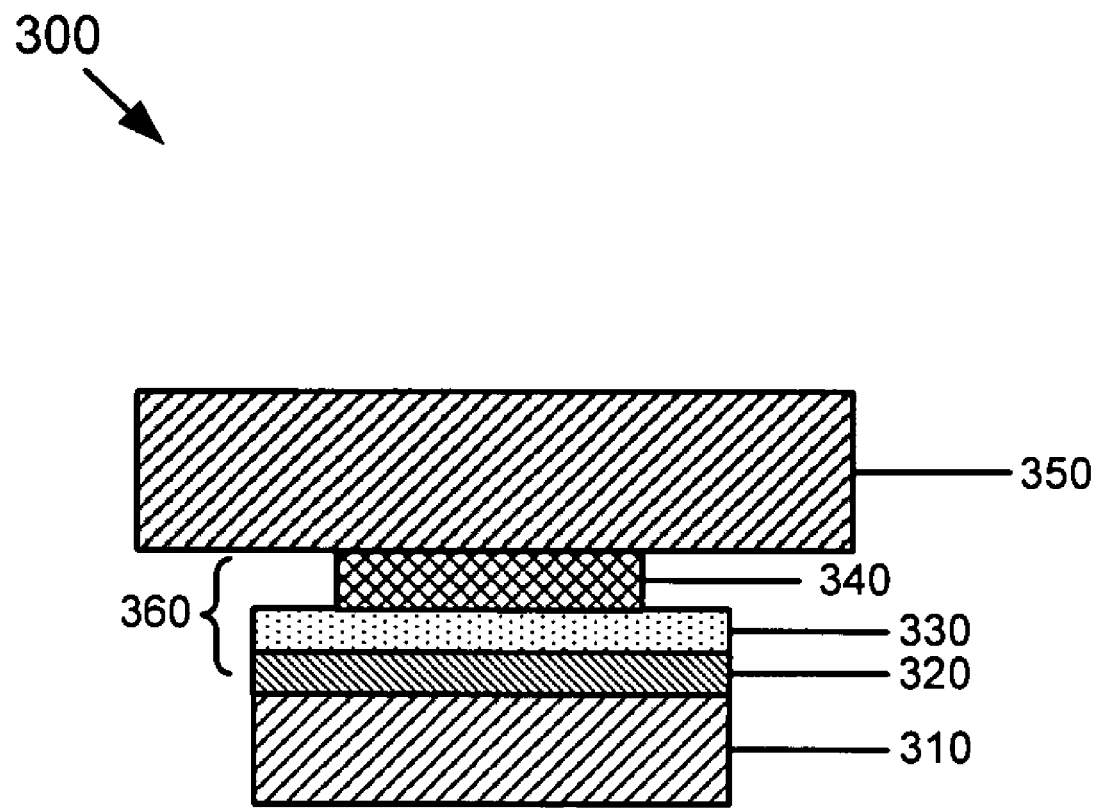
FIG. 3 illustrates an exemplary improved magnetic memory structure configuration.

FIG. 3 illustrates an exemplary improved magnetic memory structure 300. The exemplary memory structure 300 includes a first conductor 310, a data layer 320, a spacer layer 330, a reference layer 340, and a second conductor 350. For ease of explanation, the combination of the data layer 320, the spacer layer 330, and the reference layer 340 may also be referred to as a memory cell 360. Of course, the memory cell 360 may also be bottom-pinned (not shown), in which case the reference layer 340 is below the data layer 320. One difference between the magnetic memory structure 100 of FIG. 1 and the magnetic memory structure 300 of FIG. 3 is that the reference layer 340 is of a different size (in this case, a smaller size) than the data layer 320.

Depending on the particular implementation, the magnetic memory structures having the exemplary configurations described above may exhibit one or more advantages. For example, when the reference layer 340 and the data layer 320 are of different sizes relative to each other, this may help to reduce damaging effects of fringe magnetic fields emanating from the reference layer 340 that might otherwise affect nearby data layers in the memory array.

In the exemplary configuration illustrated in FIG. 3, the first conductor 310 and the second conductor 350 are orthogonal to each other and are collectively used for both write and read operations.

One skilled in the art will recognize that the memory structure configuration as illustrate in FIG. 3 is merely illustrative. Other configurations, for example, a smaller data layer relative to the reference layer, a differently shaped data and/or reference layer, a bottom-pinned configuration, etc., may also be implemented. Further, configurations having additional conductor(s) (e.g., separate conductors for read operations) and/or configurations having additional layers can also be implemented in accordance with specific design choices.

V. An Exemplary Improved Self-Aligned Via Process for Making the Exemplary Magnetic Memory Structure of FIG. 3

FIGS. 4A–4E illustrate an exemplary improved self-aligned via process for manufacturing the exemplary memory structure as shown in FIG. 3.

The process described in FIGS. 4A–4E begins after the process step shown in FIG. 2D above, where the first conductor 310, the memory cell 360 (e.g., including the data layer 320, spacer layer 330, reference layer 340), first mask layer 410, and second mask layer 420 have already been formed and patterned in accordance with techniques known in the art.

Additionally, in an exemplary implementation, either the first and/or second mask layers 410, 420 may be a hardmask layer. A hardmask layer is relatively more difficult to etch away than organic photoresist. Exemplary hardmask materials include amorphous C, TaN, SiC, SiNx, and SiOx. In yet another exemplary embodiment, either the first and/or second mask layers 410, 420, may be a metal layer (e.g., Cr, Ta, etc.), depending on design choices.

The mask layers 410, 420 as illustrated in the Figures are merely illustrative. A person skilled in the art will recognize that more or fewer mask layers may be implemented in accordance with design choice. For example, a single mask layer may be implemented if different portions of the layer have different etch rates (e.g., a greater etch rate at the base of the layer than at the top of the layer). Technologies for forming a mask layer having different etch rates within the layer are known in the art and need not be described in more detail herein. For example, a post-application treatment of a photoresist layer may make a portion of the layer more or less soluable than another portion in the layer.

Further, the undercuts developed below the second mask layer 420 are merely illustrative. In other implementations according to design choice, the undercuts may not necessarily appear.

In FIG. 2D (i.e., at the starting point of FIG. 4A), the memory cell is the same lateral width as the second mask layer, since the latter was used to define the dimensions of the former during the etch.

Figure 4A:
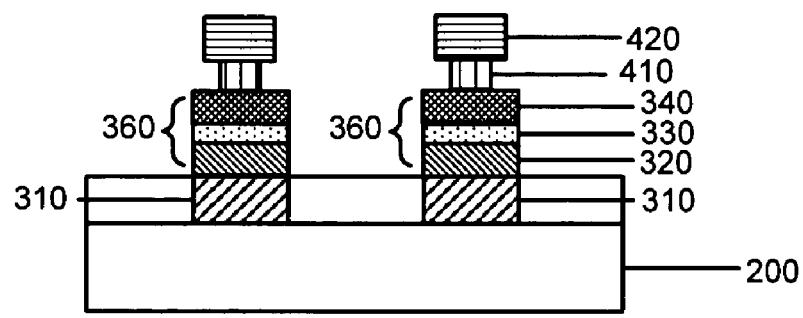
FIGS. 4A–4E illustrate an exemplary process for making the improved magnetic memory structure of FIG. 3.

In FIG. 4A, a reducing step is performed to reduce the planar dimensions of both the first mask layer 410 and the second mask layer 420. In general, the particular etching technique to be used to reduce the planar dimensions of the mask layers 410, 420 will depend on design choice. In one exemplary implementation, a reactive ion etch or a chemical wet etch may be used. If using a reactive ion etch, an anisotropic etch may be used to differentially etch the sidewalls of the first and second mask layers 410, 420 relative to the vertical thickness of the layers. This technique may prevent loss of the mask layers 410, 420 which are still needed for later processing steps.

An isotropic reactive ion etch or a wet etch may also be used as long as the desired reduction in planar dimensions can be accomplished before the mask layers become too thin for later processing steps. However, since an isotropic reactive ion etch (as well as a wet etch) generally etches in all directions, the mask layers 410, 420 may also lose their sharp corners at the edges. Rounded corners in the mask layers will subsequently affect the shape of other layers (e.g., reference layer and/or data layer) to be etched using the mask layers 410, 420 as a mask.

At the end of the processing shown in FIG. 4A, mask layers 410 and 420 have been reduced in size in at least one lateral dimension, and mask layer 420 is now narrower than memory cell 360. The reduced mask layers 410, 420 may be used to etch one or more layers in the memory cell 360, for example, to etch the reference layer 340 to a smaller size relative to the data layer 320. The reduction amount depends on design choice. For example, one could calculate the reduction in size of the reference layer 340 necessary to reduce the fringe magnetic fields by a desired amount then reduce the mask layers accordingly.

Figure 4B:
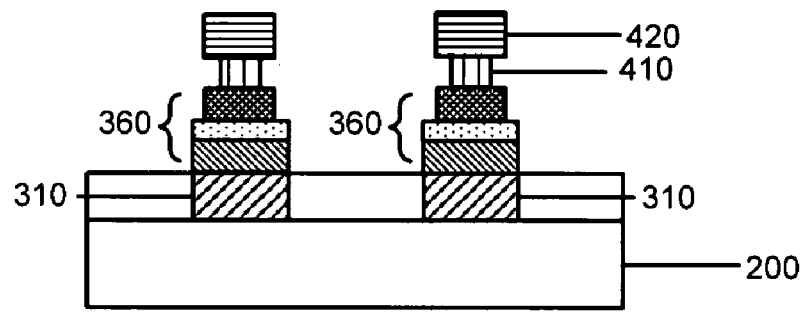

In FIG. 4B, a portion of a layer in the memory cell 360, for example, the reference layer 340, is etched using the reduced mask layers 410 and 420. Thus, the reference layer 340 is of a different size (e.g., smaller) than the data layer 320. In an exemplary implementation, a highly directional physical etching technique, such as an ion beam etching/milling, is used. The reduced reference layer 340 is merely illustrative. One skilled in the art will recognize that more than one layer (e.g., multi-layer reference layer, spacer layer, seed layer, AFM layer, etc.) may be etched. Further, in other configurations (e.g., bottom-pinned), the data layer 320 (which may comprise one or more layers of materials) may be etched instead to a smaller size relative to the reference layer 340.

Figure 4C:
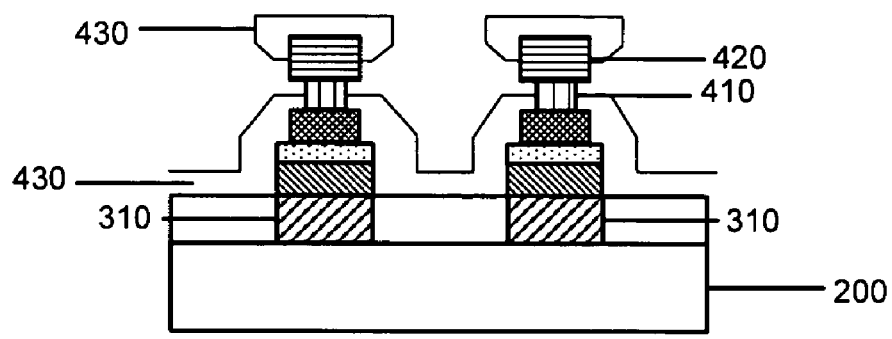

In FIG. 4C, a layer of dielectric material 430 is formed using deposition or other techniques known in the art. Because of the undercuts below the second reduced mask layer 420, some portions of the sidewalls of the first reduced mask layer 410 will not be coated with the dielectric material 430. In some implementations, the undercuts may not be present. In these implementations, the dielectric material may also coat the sidewalls of the mask layer 410.

Figure 4D:
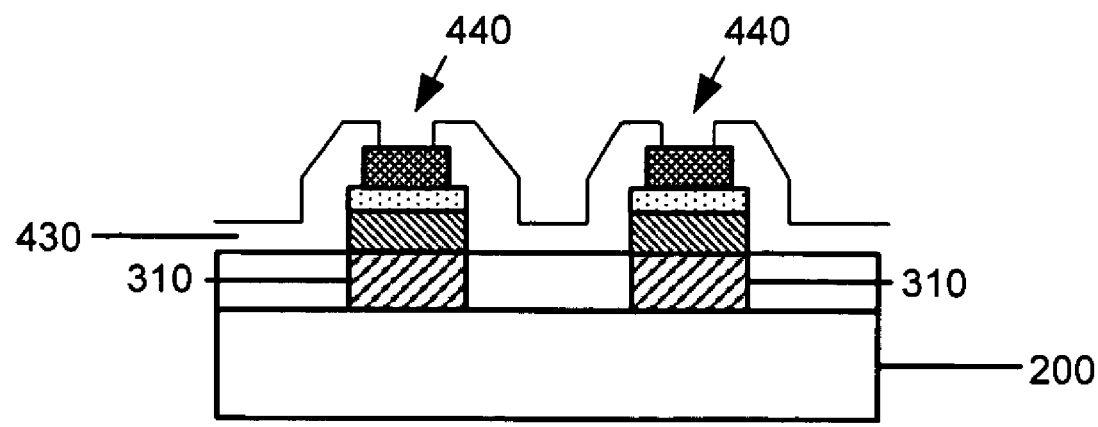

In FIG. 4D, the first and second reduced mask layers 410, 420 are removed using etching (dry or wet) techniques known in the art. At this point, in this exemplary implementation, a via 440 substantially surrounded by dielectric material 430 is formed on top of the reduced reference layer 340 and a second conductor may be formed without concern for short circuits that may be created by spillage of the conducting material onto the data layer 320. In an exemplary implementation where there were no undercuts below the second mask layer 420, the via 440 may be substantially the same size as the memory cell 360. In this implementation, a second conductor may need to be formed with more caution against potential short circuits.

Figure 4E:
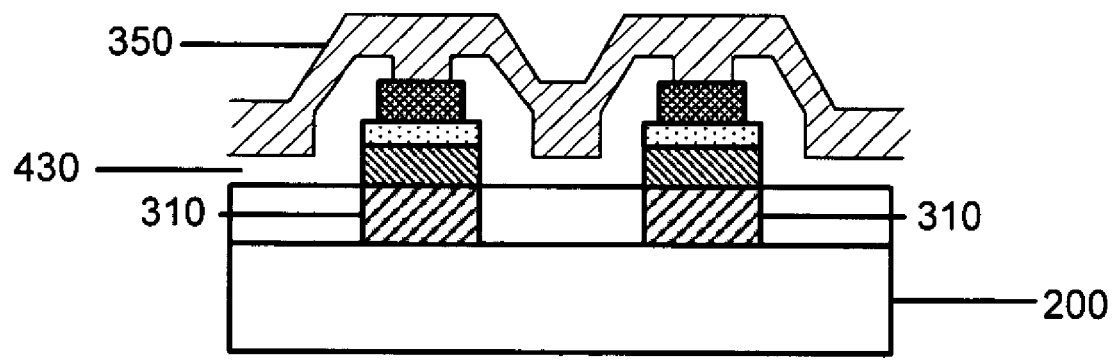

In FIG. 4E, the second conductor 350 is formed by deposition and patterning techniques known in the art.

The manufacturing steps illustrated above are merely exemplary. Those skilled in the art will appreciate that other manufacturing steps may be used in accordance with the requirements of a particular implementation. For example, the various layers as illustrated in FIGS. 4A–4E may be formed in accordance with other manufacturing sequences (e.g., the reference layer 340 may be formed first in a bottom-pinned memory structure), one or more layers may be formed at the same time, one or more layers of different materials may be combined to form a single layer (e.g., a data layer), etc.

Further, the TMR memory cell illustrated above is merely exemplary. Those skilled in the art will appreciate that other types of memory cells (e.g., GMR memory cells, etc.) may be constructed according to the requirements of a particular implementation. For example, the spacer layer 330 may be a non-magnetic conducting layer for constructing a GMR memory cell.

VI. Conclusion

The foregoing examples illustrate certain exemplary embodiments from which other embodiments, variations, and modifications will be apparent to those skilled in the art. The inventions should therefore not be limited to the particular embodiments discussed above, but rather are defined by the claims. Furthermore, some of the claims may include alphanumeric identifiers to distinguish the elements and/or recite elements in a particular sequence. Such identifiers or sequence are merely provided for convenience in reading, and should not necessarily be construed as requiring or implying a particular order of steps, or a particular sequential relationship among the claim elements.

What is claimed is:

1. A method for making a memory structure having different-sized memory cell layers, comprising:

forming at least two layers of ferromagnetic materials;

forming at least one mask layer above said ferromagnetic materials;

patterning said at least one mask layer;

etching said ferromagnetic materials using said at least one mask layer as a first etch transfer mask;

laterally reducing a planar dimension of said at least one mask layer to be narrower than said ferromagnetic materials; and etching a layer of said ferromagnetic materials using said reduced at least one mask layer as a second etch transfer mask, such that said ferromagnetic layer being etched becomes a different lateral size than another ferromagnetic layer of said ferromagnetic materials.

2. The method of claim 1, wherein said at least one mask layer includes a had mask material.

3. The method of claim 1, wherein said at least one mask layer includes a metal.

4. The method of claim 1, wherein said at least one mask layer includes a photoresist material.

5. The method of claim 1, wherein said at least one mask layer includes a first mask layer and a second mask layer.

6. The method of claim 5, wherein said patterning said at least one mask layer comprises etching at least said first mask layer until an undercut appears below said second mask layer.

7. The method of claim 6 further comprising etching said second mask layer to form a patterned second mask layer, before said etching of said first mask layer.

8. The method of claim 6, wherein said etching said first mask layer includes etching in a chemical solvent that preferentially etches said first mask layer relative to said second layer.

9. The method of claim 1, wherein said etching said ferromagnetic materials includes forming a memory cell comprising said at least two layers of ferromagnetic materials.

10. The method of claim 9, wherein said memory cell includes a data layer, a spacer layer, and a reference layer.

11. The method of claim 1, wherein said laterally reducing includes performing a reactive ion etch.

12. The method of claim 11, wherein said reactive ion etch is an anisotropic etch.

13. The method of claim 11, wherein said reactive ion etch is an isotropic etch.

14. The method of claim 1, wherein said laterally reducing includes performing a chemical wet etch.

15. The method of claim 1, wherein said laterally reducing comprises:
performing an etch to reduce a planer dimension of said at least one mask layer.

16. The method of claim 1, wherein said etching a layer of said ferromagnetic materials using said reduced at least one mask layer comprises etching away a portion of said ferromagnetic layer not protected by said reduced at least one mask layer.

17. The method of claim 16, wherein said etching away a portion of said ferromagnetic layer includes a highly directional physical etching.

18. The method of claim 17, wherein said physical etching includes ion beam milling.

19. A method for making a memory structure having different-sized data and reference layers, thereby reducing the likelihood that fringe magnetic fields from one of said layers can adversely affect another of said layers, comprising:
forming a memory cell including at least a data layer and a reference layer;
forming a mask above said memory cell;
using said mask to etch said memory cell;
etching said mask to be narrower than said memory cell in at least one lateral dimension; and
using said narrowed mask to etch at least one of said layers to be narrower than another of said layers in at least one lateral dimension.

20. The method of claim 19 wherein an amount of narrowing of said layer depends on a desired amount of fringe magnetic field reduction.

* * * * *

UNITED STATES PATENT AND TRADEMARK OFFICE
CERTIFICATE OF CORRECTION

PATENT NO. : 7,195,927 B2 Page 1 of 1
APPLICATION NO. : 10/691139
DATED : March 27, 2007
INVENTOR(S) : Manish Sharma et al.

It is certified that error appears in the above-identified patent and that said Letters Patent is hereby corrected as shown below:

In column 9, line 2, in Claim 2, delete "had" and insert -- hard --, therefor.

In column 10, line 3, in Claim 15, delete "planer" and insert -- planar --, therefor.

Signed and Sealed this

Fourth Day of November, 2008

JON W. DUDAS
*Director of the United States Patent and Trademark Office*